United States Patent [19]

Killion

[11] Patent Number: 5,623,550

[45] Date of Patent: Apr. 22, 1997

[54] BATTERY POWER SUPPLY CIRCUIT WHICH SUPPLIES CORRECT POWER POLARITY IRRESPECTIVE OF BATTERY ORIENTATION

[75] Inventor: Mead Killion, Elk Grove Village, Ill.

[73] Assignee: Etymotic Research, Inc., Elk Grove Village, Ill.

[21] Appl. No.: 400,876

[22] Filed: Mar. 8, 1995

[51] Int. Cl.⁶ .................................................. H04R 25/00
[52] U.S. Cl. ........................... 381/69.2; 363/63; 307/127
[58] Field of Search ............................. 363/63; 307/127; 381/69.2, 68

[56] References Cited

U.S. PATENT DOCUMENTS

| | | | |
|---|---|---|---|
| 4,423,456 | 12/1983 | Zaidenweber | 307/127 |
| 5,210,804 | 5/1993 | Schmid | 381/69.2 |

OTHER PUBLICATIONS

Co–pending parent application USSN 08/407,465, filed Mar. 20, 1995.
Schematic drawing of Tom Lott, 1986.

*Primary Examiner*—Curtis Kuntz
*Assistant Examiner*—Duc Nguyen
*Attorney, Agent, or Firm*—McAndrews, Held & Malloy Ltd.

[57] ABSTRACT

A power supply circuit is set forth which overcomes the problems associated with incorrect battery insertion. The power supply circuit includes first and second battery terminals for electrical connection to the battery. The first and second battery terminals are connected to a first transistor switching circuit. The first transistor switching circuit is responsive to power from the battery to through-connect a negative polarity power signal therethrough irrespective of the polarity orientation of the battery. The first and second battery terminals are also connected to a second transistor switching circuit. The second switching circuit is responsive to power from the battery to through-connect a positive polarity power signal therethrough irrespective of polarity orientation of the battery. The negative and positive polarity power signals are available for connection to a load device, such as a hearing aid amplifier. The device is thereby provided with proper power polarity irrespective of the way in which the battery is inserted between the first and second battery terminals.

16 Claims, 5 Drawing Sheets

5,623,550

BATTERY POWER SUPPLY CIRCUIT WHICH SUPPLIES CORRECT POWER POLARITY IRRESPECTIVE OF BATTERY ORIENTATION

TECHNICAL FIELD

The present invention relates generally to the field of power supplies. More particularly, the present invention relates to a battery power supply circuit that supplies correct power polarity to a load device irrespective of the orientation of the battery.

BACKGROUND

Devices which use batteries as a source of power are well known. Such devices include, but are not limited to, portable radios, portable communications devices, and medical devices such as hearing aids.

Most devices that use batteries as a power source provide an access panel or the like which allows the user to install or replace the batteries. Such access by the user increases the possibility for human errors. One type of human error that is frequently encountered is a battery polarity error. A battery polarity error occurs when the user inserts the battery in the device with a reversed polarity. As a result of the error, the positive terminal of the battery is connected to the negative power terminal of the device and the negative terminal of the battery is connected to the positive terminal of the device. With the battery connected to the device with a reversed polarity, the device will generally not work or, in some instances, may be damaged. Even in the absence of permanent damage, a polarity error can be a source of frustration to the user, particularly when the battery is a disc-type battery, such as the type used in a hearing aid, since it is often difficult for the ordinary user to discern between the positive and negative terminals on such batteries. As such, it may be difficult for the user to perform the initial installation correctly and to subsequently diagnose the polarity insertion error.

SUMMARY OF THE INVENTION

A power supply circuit is set forth which overcomes the problems associated with incorrect battery insertion. The power supply circuit includes first and second battery terminals for electrical connection to the battery. The first and second battery terminals are connected to a first transistor switching circuit. The first transistor switching circuit is responsive to power from the battery to through-connect a negative polarity power signal therethrough irrespective of the polarity orientation of the battery. The first and second battery terminals are also connected to a second transistor switching circuit. The second switching circuit is responsive to power from the battery to through-connect a positive polarity power signal therethrough irrespective of polarity orientation of the battery. The negative and positive polarity power signals are available for connection to a load device, such as a hearing aid. The device is thereby provided with proper power polarity irrespective of the way in which the battery is inserted between the first and second battery terminals.

In accordance with one embodiment of the power supply circuit, the first and second transistor switching circuits have a particular circuit topology of MOS transistors. In this topology, the first switching circuit includes two n-channel MOSFETs, each having a gate terminal, a drain terminal, and a source terminal. The drain terminal of the first n-channel MOSFET is connected to the first battery terminal while the gate terminal is connected to the second battery terminal. The drain terminal of the second n-channel MOSFET is connected to the second battery terminal while the gate terminal of the second n-channel MOSFET is connected to the first battery terminal. The source terminal of the first n-channel MOSFET is connected to the source terminal of the second n-channel MOSFET. The negative polarity power signal is available at the source terminals of the n-channel MOSFETS.

The second transistor switching circuit of this topology includes two p-channel MOSFETs, each having a gate terminal, a drain terminal, and source terminal. The drain terminal of the first p-channel MOSFET is connected to the first battery terminal and the gate is connected to the second battery terminal. The drain terminal of the second p-channel transistor is connected to the second battery terminal while the gate thereof is connected to the first battery terminal. The source terminals of the first and second p-channel MOSFETs are connected to one another and supply the positive polarity power signal. The load may then be connected between the source terminals of the n-channel MOSFETs supplying the negative polarity power signal and the source terminals of the p-channel MOSFETs supplying the positive polarity power signal so that the device receives power of constant polarity notwithstanding the orientation of the battery.

Other objects and advantages of the present invention will become apparent upon reference to the accompanying detailed description when taken in conjunction with the following drawings.

DETAILED DESCRIPTION OF THE PREFERRED EMBODIMENT

Figure 1:
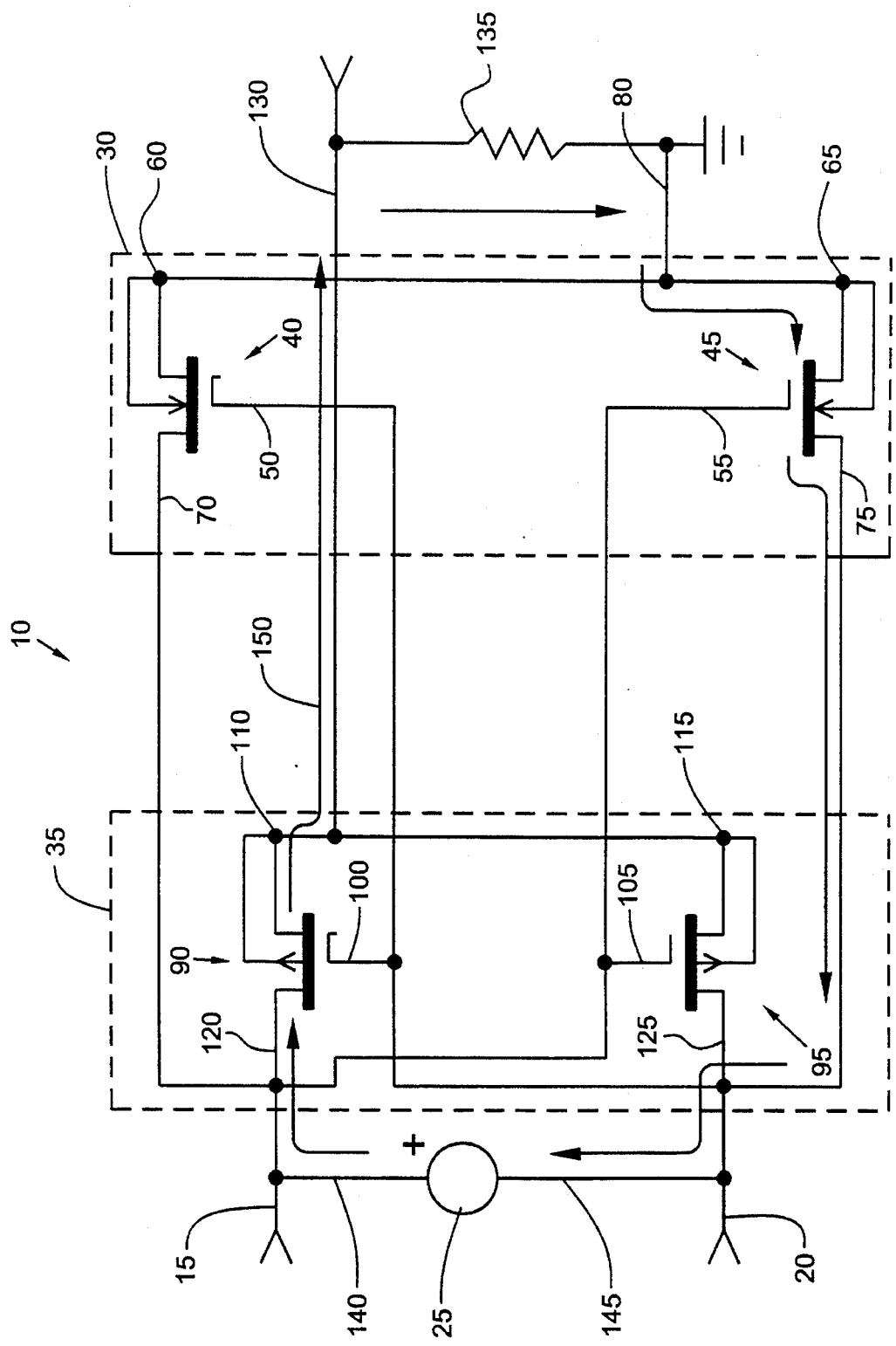
FIG. 1 is a schematic diagram of one embodiment of a power supply circuit for use in supplying power of constant polarity from a battery to a load irrespective of the polarity orientation of the battery.

A power supply circuit 10 constructed in accordance with one embodiment of the present invention is illustrated in FIG. 1. As illustrated, the power supply circuit 10 includes a first terminal 15 and a second terminal 20 that are connected to a battery 25. Terminals 15 and 20 supply battery power to a first transistor switching circuit 30 and a second transistor switching circuit 35.

The first transistor switching circuit 30 includes first and second n-channel MOSFETs 40 and 45, each having a gate terminal 50, 55, a source terminal 60, 65, and a drain terminal 70, 75 respectively, and which operate, for example, in enhancement mode. The gate terminal 50 of first n-channel MOSFET 40 is connected to the second battery terminal 20. The drain terminal 70 of first n-channel MOSFET 40 is connected to the first battery terminal 15. The gate terminal 55 of the second n-channel MOSFET 45 is connected to the first battery terminal 15 while the drain terminal 75 is connected to the second battery terminal 20. The sources 60 and 65 of the first and second n-channel MOSFETS 40, 45 are connected together and supply a negative polarity power signal at line 80.

The second transistor switching circuit 35 includes first and second p-channel MOSFETs 90 and 95, each having a gate terminal 100, 105, a source terminal 110, 115, and a drain terminal 120, 125, respectively, and which operate, for example, in enhancement mode. The gate terminal 100 of first p-channel MOSFET 90 is connected to the second battery terminal 20. The drain terminal 120 of first p-channel MOSFET 90 is connected to the first battery terminal 15. The gate terminal 105 of the second p-channel MOSFET 95 is connected to the first battery terminal 15 while the drain terminal 125 is connected to the second battery terminal 20. The sources 110 and 115 of the first and second p-channel MOSFET 90, 95 are connected together and supply a positive polarity power signal at line 130.

In operation, the first transistor switching circuit through-connects the negative polarity terminal of the battery 25 to terminal 80 for supply to a load 135 irrespective of the polarity of the battery 25 between battery terminals 15 and 20. Similarly, the second transistor switching circuit 35 through-connects the positive polarity terminal of the battery 25 to terminal 130 for supply to the load 135 irrespective of the polarity of the battery 25 between terminals 15 and 20.

Operation of the circuit 10 can be illustrated with reference to FIGS. 1 and 2 which show connection of the battery to terminals 15 and 20 with two different polarity orientations. In FIG. 1, the battery 25 has its positive terminal 140 connected to the first battery terminal 15 and its negative battery terminal 145 connected to the second battery terminal 20. In this orientation, the battery supplies control voltages to the gate terminals 50, 55, 100 and 105 of the MOSFETs 40, 45, 90, and 95. The control voltages cause first p-channel MOSFET 90 and second n-channel MOSFET 45 to go to a conductive state while causing second p-channel MOSFET 95 and first n-channel MOSFET 40 to go to a non-conductive state. As such, MOSFET 90 through-connects the power at the positive terminal 140 of the battery 25 to line 130 to supply the positive polarity power signal at line 130 to the load 135. Similarly, MOSFET 45 through-connects the power at negative terminal 145 of the battery 25 to line 80 to supply the negative polarity power signal at line 80 to the load 135. The MOSFETs 45 and 90 thus provide a current path therethrough illustrated by arrow 150.

Figure 2:
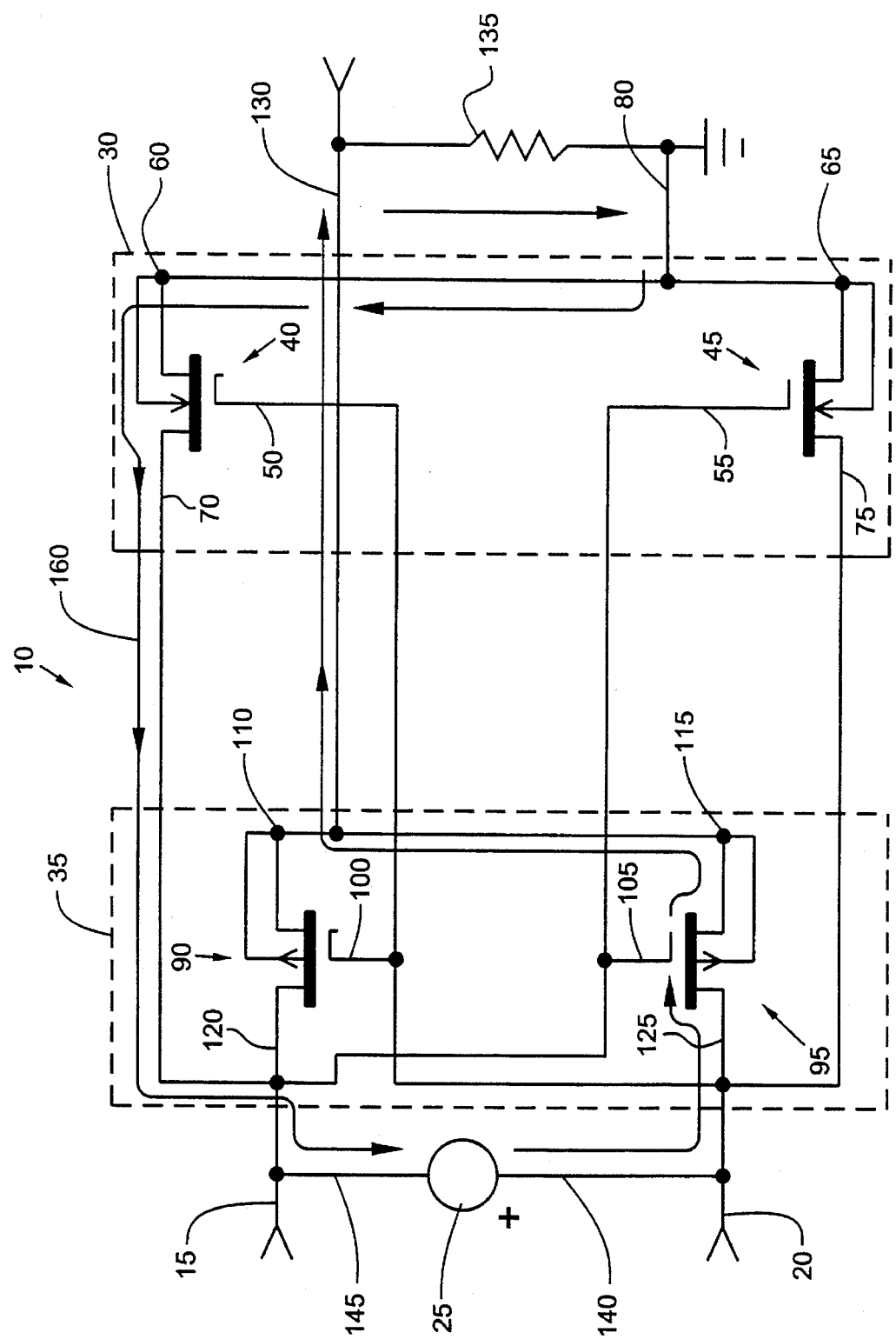
FIG. 2 is a schematic diagram of the circuit of FIG.1 illustrating current flow through the circuit when the battery is in a polarity orientation differing from the one shown in FIG. 1.

In FIG. 2, the battery 25 has its positive terminal 140 connected to the second battery terminal 20 and its negative battery terminal 145 connected to the first battery terminal 15. In this orientation, the battery 25 supplies control voltages to the gate terminals 50, 55, 100 and 105 of the MOSFETs 40, 45, 90, and 95 which are opposite those supplied in connection with the battery orientation illustrated in FIG. 1. The control voltages supplied in FIG. 2 cause second p-channel MOSFET 95 and first n-channel MOSFET 40 to go to a conductive state while causing first p-channel MOSFET 90 and second n-channel MOSFET 45 to go to a non-conductive state. As such, MOSFET 95 through-connects the power at the positive terminal 140 of the battery 25 to line 130 to supply the positive polarity power signal to the load 135. Similarly, MOSFET 40 through-connects the power at negative terminal 145 of the battery 25 to line 80 to supply the negative polarity power signal to the load 135. The MOSFETs 40 and 95 thus provide a current path therethrough illustrated by arrow 160.

Figure 3:
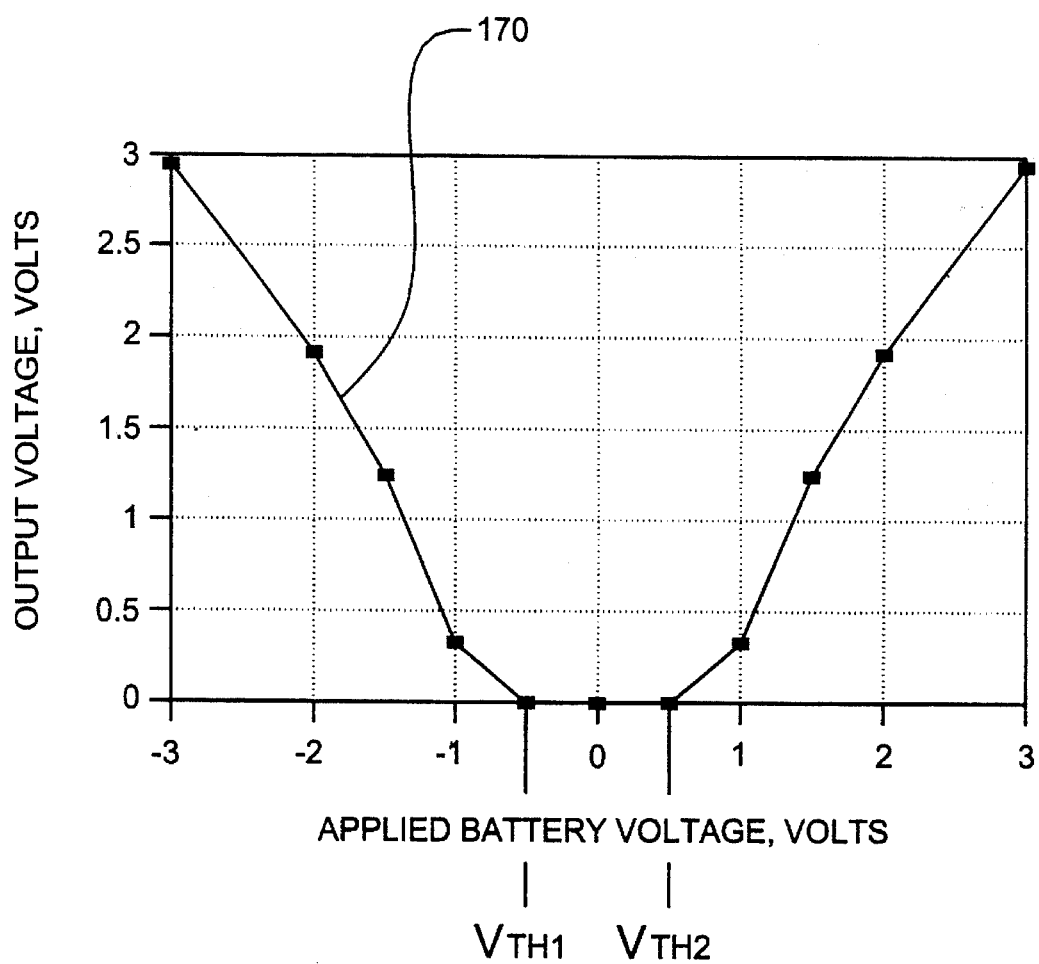
FIG. 3 is an exemplary graph of output voltage versus battery input voltage at the battery input terminals for the circuit of FIG. 1.

FIG. 3 is a graph illustrating the voltage at output lines 130 and 80 versus the battery voltage supplied across battery terminals 15 and 20. As illustrated, the output voltage, illustrated by line 170, generally tracks the magnitude of the battery voltage for battery voltages below a first threshold voltage $V_{TH1}$. The output voltage, however, is of opposite polarity for battery voltages below $V_{TH1}$. The circuit 10 does not conduct battery power to the output lines 130 and 80 for voltages between the first threshold voltage $V_{TH1}$ and a second threshold voltage $V_{TH2}$. For voltages greater than $V_{TH2}$, the output voltage generally tracks both the polarity and magnitude of the battery voltage. The non-conductive range between $V_{TH1}$ and $V_{TH2}$ can be minimized by employing MOSFETs having very low threshold voltages. Additionally, the output voltage will more closely track the input voltage from the battery where MOSFETs having low source to drain resistances are employed.

As can be recognized by those skilled in the art, the power supply circuit 10 can function as a transistor rectifier circuit which is relatively lossless compared to diode rectifier circuits, particularly when the threshold voltages of the MOSFETs and the source to drain resistances of the MOSFETs are made to be very low.

Figure 4:
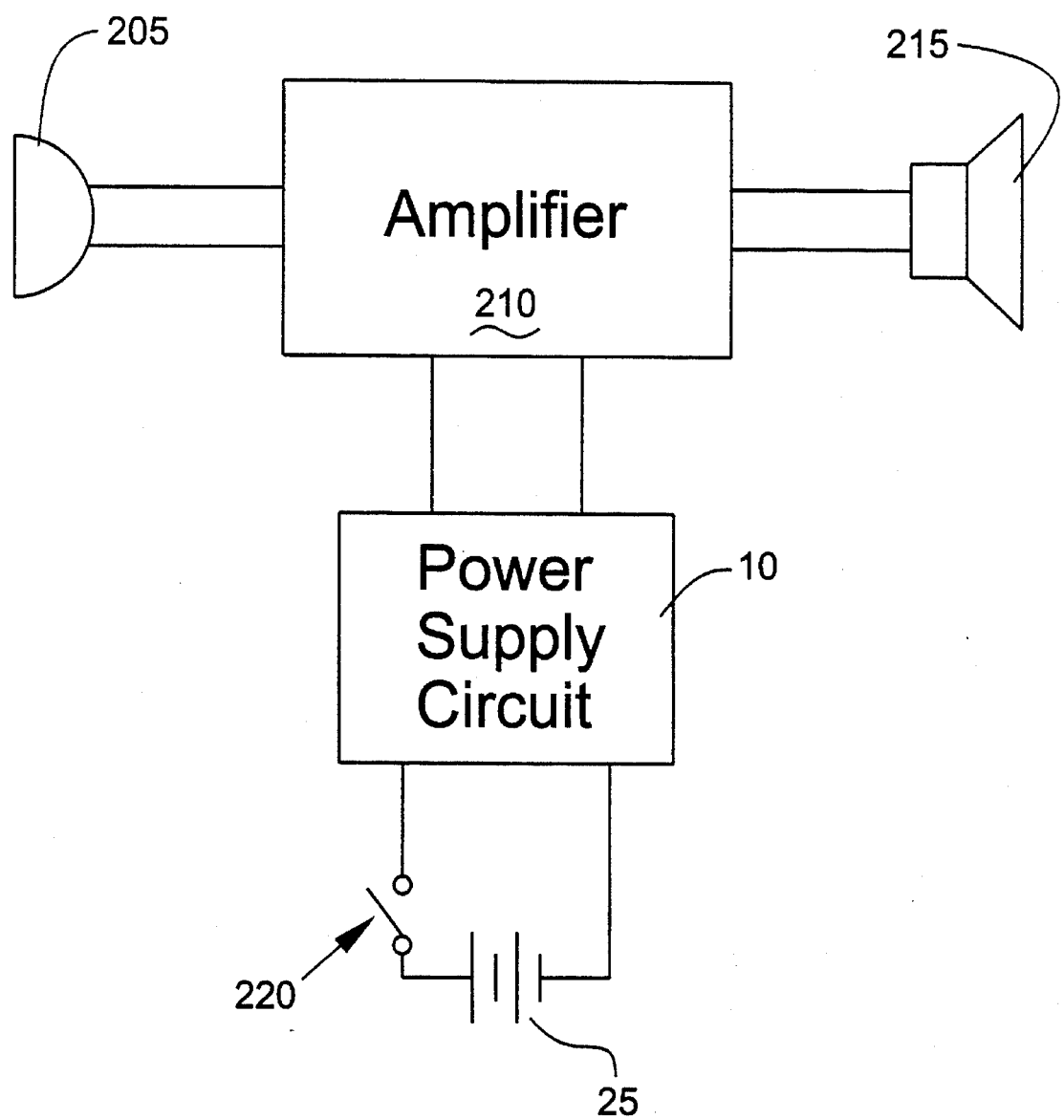
FIG. 4 is a schematic block diagram of a hearing aid employing the circuit of FIG.1.

FIG. 4 illustrates one embodiment of a hearing aid 200 employing the power supply circuit 10. The power supply circuit 10 is particularly well suited for use in the hearing aid since most hearing aids receive their power from low-voltage (about 1.3 VDC) disc-type batteries. Hearing aid users often find it difficult to properly orient the battery with the correct polarity in the hearing aid 200. Therefore, the hearing aid user benefits from the hearing aid 200 being operable irrespective of the battery polarity orientation. Additionally, the power supply circuit 10, being constructed from FETs having limited drain to source resistances as well as requiring minimal control current and gate voltages, is relatively lossless making it particularly well suited to the low voltage operation of the hearing aid 200.

As illustrated, the hearing aid 200 includes a microphone 205, an amplifier 210, a receiver 215, a battery 25 and the power supply circuit 10. The microphone 205 operates to transduce sound waves to electrical signals which are subsequently amplified by the amplifier 210. The amplifier output is supplied to the receiver 215 which transduces the electrical signals output from the amplifier 210 to sound waves which may be heard by the user. The amplifier 210 receives power from the battery 25 through an on/off switch 220 and the power supply circuit 10. The microphone 205 may receive power from the amplifier. As will be readily recognized by those skilled in the art, the amplifier 210 may include various filter and amplification circuitry which tailors the amplifier response output to the particular hearing loss of the user.

Figure 5:
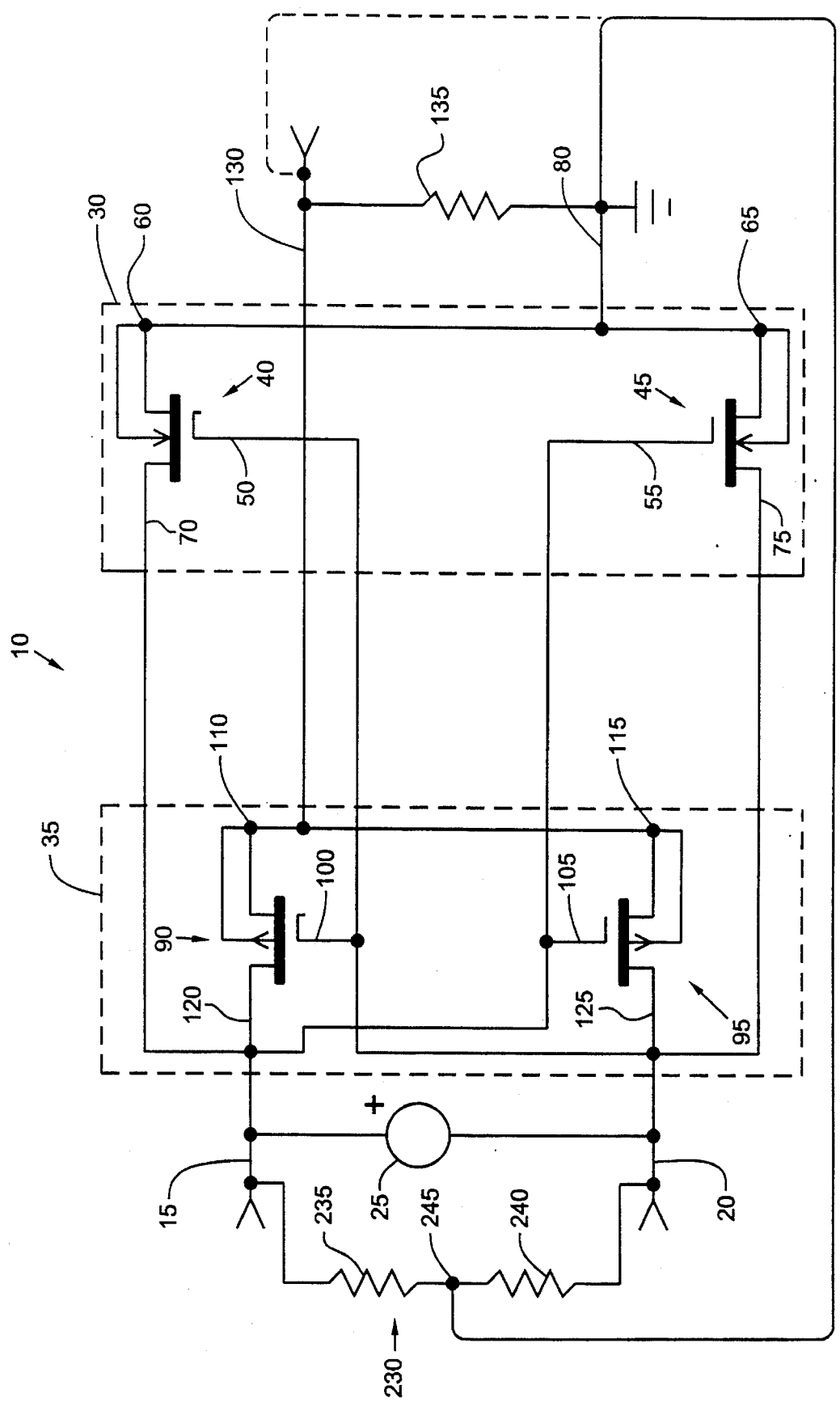
FIG. 5 is a schematic diagram of the power supply circuit of FIG. 1 with a voltage divider circuit that may assist in ensuring proper start-up operation.

FIG. 5 illustrates a further embodiment of the power supply circuit 10 which includes a voltage divider circuit 230 that may assist in ensuring proper start-up operation. The voltage divider circuit 230 is connected between terminals 15 and 20 and includes resistors 235 and 240. The resistors 235 and 240 may, for example, each have a resistance of 100K. The voltage divider circuit 230 includes a central node 245 that is connected to the negative power polarity signal at line 80. Alternatively, node 245 may be connected to the positive power polarity signal at line 130.

Although the MOSFETs 40, 45, 90, 95 of the circuit 10 are illustrated as operating in enhancement mode, a similar configuration can be implemented using depletion mode MOSFETs. In such instance, the cut-off voltages of the depletion mode MOSFETs should be greater than the minimum battery voltage at which the load device must operate.

Although the present invention has been described with reference to a specific embodiment, those of skill in the art will recognize that changes may be made thereto without departing from the scope and spirit of the invention as set forth in the appended claims.

We claim as our invention:

1. A hearing aid comprising:

a microphone for transducing audio waves into electronic signals;

an amplifier for amplifying the electronic signals;

a receiver for transducing the amplified electronic signals to sound waves;

a battery for supplying power to the amplifier; and battery switch means including first and second battery terminals in electrical contact with the battery for supplying power of correct polarity to the amplifier irrespective of battery polarity orientation, the battery switch means comprising a first transistor switching circuit connected between the first and second battery terminals and responsive to voltage from the battery to through-connect a negative polarity power signal therethrough, the first transistor switching circuit comprising a first n-channel MOSFET having gate terminal, a drain terminal, and a source terminal, the drain terminal being connected to the first battery terminal the gate terminal being connected to the second battery terminal, a second n-channel MOSFET having a gate terminal, a drain terminal, and a source terminal, the drain terminal being connected to the second battery terminal, the gate terminal being connected to the first batten/terminal, the source terminal of the first n-channel MOSFET being connected to the source terminal of the second n-channel MOSFET and supplying the negative polarity power signal, and a voltage divider circuit disposed between the first and second battery terminals and connected to the source terminals of the first and second n-channel MOSFETs, the voltage divider circuit comprising a first resistor having a first terminal connected to the first battery terminal, and a second terminal, and a second resistor having a first terminal connected to the second battery terminal, and a second terminal connected to the second terminal of the first resistor, the second terminals of the first and second resistors being connected to the source terminals of the first and second n-channel MOSFETs, and a second transistor switching circuit connected between the first and second battery terminals and responsive to voltage from the battery to through-connect a positive polarity power signal therethrough.

2. A hearing aid as claimed in claim 1 wherein the second transistor switching circuit comprises:

a) a first p-channel MOSFET having a gate terminal, a drain terminal, and a source terminal, the drain terminal being connected to the first battery terminal, the gate terminal being connected to the second battery terminal; and b) a second p-channel MOSFET having a gate terminal, a drain terminal, and a source terminal, the drain terminal being connected to the second battery terminal, the gate terminal being connected to the first battery terminal, the source terminal of the first p-channel MOSFET being connected to the source terminal of the second p-channel MOSFET and supplying the positive polarity power signal.

3. A hearing aid as claimed in claim 2 and further comprising a voltage divider circuit disposed between the first and second battery terminals and connected to the source terminals of the first and second p-channel MOSFETs.

4. A hearing aid as claimed in claim 3 wherein the voltage divider circuit comprises:

a) a first resistor having a first terminal connected to the first battery terminal, and a second terminal; and b) a second resistor having a first terminal connected to the second battery terminal, and a second terminal connected to the second terminal of the first resistor, the second terminals of the first and second resistors being connected to the source terminals of the first and second p-channel MOSFETs.

5. A power supply circuit for supplying power from a battery, the power supply circuit comprising:

first and second battery terminals for electrical connection to the battery;

a first transistor switching circuit connected between the first and second battery terminals and responsive to voltage from the battery to through-connect a negative polarity power signal therethrough irrespective of polarity orientation of the battery, the first transistor switching circuit comprising a first n-channel MOSFET having a gate terminal, a drain terminal, and a source terminal, the drain terminal being connected to the first battery terminal, the gate terminal being connected to the second battery terminal, a second n-channel MOSFET having a gate terminal, a drain terminal, and a source terminal, the drain terminal being connected to the second battery terminal, the gate terminal being connected to the first battery terminal, the source terminal of the first n-channel MOSFET being connected to the source terminal of the second n-channel MOSFET and supplying the negative polarity power signal, and a voltage divider circuit disposed between the first and second battery terminals and connected to the source terminals of the first and second n-channel MOSFETs, the voltage divider circuit comprising a first resistor having a first terminal connected to the first battery terminal, and a second terminal, and a second resistor having a first terminal connected to the second battery terminal, and a second terminal connected to the second terminal of the first resistor, the second terminals of the first and second resistors being connected to the source terminals of the first and second n-channel MOSFETs, and a second transistor switching circuit connected between the first and second battery terminals and responsive to voltage from the battery to through-connect a positive polarity power signal therethrough irrespective of polarity orientation of the battery.

6. A power supply circuit as claimed in claim 5 wherein the second transistor switching circuit comprises:

a) a first p-channel MOSFET having a gate terminal, a drain terminal, and a source terminal, the drain terminal being connected to the first battery terminal, the gate terminal being connected to the second battery terminal; and b) a second p-channel MOSFET having a gate terminal, a drain terminal, and a source terminal, the drain terminal being connected to the second battery terminal, the gate being connected to the first battery terminal, the source terminal of the first p-channel MOSFET being connected to the source terminal of the second p-channel MOSFET and supplying the positive polarity power signal.

7. A power supply circuit aid as claimed in claim 6 and further comprising a voltage divider circuit disposed between the first and second battery terminals and connected to the source terminals of the first and second p-channel MOSFETs.

8. A power supply circuit as claimed in claim 7 wherein the voltage divider circuit comprises:

a) a first resistor having a first terminal connected to the first battery terminal, and a second terminal; and b) a second resistor having a first terminal connected to the second battery terminal, and a second terminal connected to the second terminal of the first resistor, the second terminals of the first and second resistors being connected to the source terminals of the first and second p-channel MOSFETs.

9. A hearing aid comprising:

a microphone for transducing audio waves into electronic signals;

an amplifier for amplifying the electronic signals;

a receiver for transducing the amplified electronic signals to sound waves;

a battery for supplying power to the amplifier; and battery switch means including first and second battery terminals in electrical contact with the battery for supplying power of correct polarity to the amplifier irrespective of battery polarity orientation, the battery switch means comprising a first transistor switching circuit connected between the first and second battery terminals and responsive to voltage from the battery to through-connect a negative polarity power signal therethrough, and a second transistor switching circuit connected between the first and second battery terminals and responsive to voltage from the battery to through-connect a positive polarity power signal therethrough, the second transistor switching circuit comprising a first p-channel MOSFET having a gate terminal, a drain terminal, and a source terminal, the drain terminal being connected to the first battery terminal, the gate terminal being connected to the second battery terminal;

a second p-channel MOSFET having a gate terminal, a drain terminal, and a source terminal, the drain terminal being connected to the second battery terminal, the gate terminal being connected to the first battery terminal, the source terminal of the first p-channel MOSFET being connected to the source terminal of the second p-channel MOSFET and supplying the positive polarity power signal, and a voltage divider circuit disposed between the first and second battery terminals and connected to the source terminals of the first and second p-channel MOSFETs, the voltage divider circuit comprising a first resistor having a first terminal connected to the first battery terminal, and a second terminal, and a second resistor having a first terminal connected to the second battery terminal, and a second terminal connected to the second terminal of the first resistor, the second terminals of the first and second resistors being connected to the source terminals of the first and second p-channel MOSFETs.

10. A hearing aid as claimed in claim 9 wherein the first transistor switching circuit comprises:

a first n-channel MOSFET having a gate terminal, a drain terminal, and a source terminal, the drain terminal being connected to the first battery terminal, the gate terminal being connected to the second battery terminal; and a second n-channel MOSFET having a gate terminal, a drain terminal, and a source terminal, the drain terminal being connected to the second battery terminal, the gate terminal being connected to the first battery terminal, the source terminal of the first n-channel MOSFET being connected to the source terminal of the second n-channel MOSFET and supplying the negative polarity power signal.

11. A hearing aid as claimed in claim 10 and further comprising a voltage divider circuit disposed between the first and second battery terminals and connected to the source terminals of the first and second n-channel MOSFETs.

12. A hearing aid as claimed in claim 11 wherein the voltage divider circuit comprises:

a first resistor having a first terminal connected to the first battery terminal, and a second terminal; and a second resistor having a first terminal connected to the second battery terminal, and a second terminal connected to the second terminal of the first resistor, the second terminals of the first and second resistors being connected to the source terminals of the first and second n-channel MOSFETs.

13. A power supply circuit for supplying power from a battery, the power supply circuit comprising:

first and second battery terminals for electrical connection to the battery;

a first transistor switching circuit connected between the first and second battery terminals and responsive to voltage from the battery to through-connect a negative polarity power signal therethrough irrespective of polarity orientation of the battery; and a second transistor switching circuit connected between the first and second battery terminals and responsive to voltage from the battery to through-connect a positive polarity power signal therethrough irrespective of polarity orientation of the battery, the second transistor circuit comprising a first p-channel MOSFET having a gate terminal, a drain terminal, and a source terminal, the drain terminal being connected to the first battery terminal, the gate terminal being connected to the second battery terminal, a second p-channel MOSFET having a gate terminal, a drain terminal, and a source terminal, the drain terminal being connected to the second battery terminal, the gate terminal being connected to the first battery terminal, the source terminal of the first n-channel MOSFET being connected to the source terminal of the second n-channel MOSFET and supplying the negative polarity power signal, and a voltage divider circuit disposed between the first and second battery terminals and connected to the source terminals of the first and second p-channel MOS-
FETs, the voltage divider circuit comprising
a first resistor having a first terminal connected to the
first battery terminal, and a second terminal, and
a second resistor having a first terminal connected to
the second battery terminal, and a second terminal
connected to the second terminal of the first resis-
tor, the second terminals of the first and second
resistors being connected to the source terminals
of the first and second p-channel MOSFETs.

14. A power supply circuit as claimed in claim 13 wherein the first transistor switching circuit comprises:
a first n-channel MOSFET having a gate terminal, a drain terminal, and a source terminal, the drain terminal being connected to the first battery terminal, the gate terminal being connected to the second battery terminal; and
a second n-channel MOSFET having a gate terminal, a drain terminal, and a source terminal, the drain terminal being connected to the second battery terminal, the gate terminal being connected to the first battery terminal, the source terminal of the first n-channel MOSFET being connected to the source terminal of the second n-channel MOSFET and supplying the negative polarity power signal.

15. A power supply circuit as claimed in claim 14 and further comprising a voltage divider circuit disposed between the first and second battery terminals and connected to the source terminals of the first and second n-channel MOSFETs.

16. A power supply circuit as claimed in claim 15 wherein the voltage divider circuit comprises:
a first resistor having a first terminal connected to the first battery terminal, and a second terminal; and
a second resistor having a first terminal connected to the second battery terminal, and a second terminal con-
nected to the second terminal of the first resistor, the second terminals of the first and second resistors being connected to the source terminals of the first and second n-channel MOSFETs.

* * * * *